(12) United States Patent
Palle et al.

(10) Patent No.: US 10,181,527 B2
(45) Date of Patent: Jan. 15, 2019

(54) FINFET HAVING DUAL VERTICAL SPACER AND METHOD OF MANUFACTURING THE SAME

(71) Applicant: Samsung Electronics Co., Ltd., Suwon-si, Gyeonggi-do (KR)

(72) Inventors: Dharmendar Reddy Palle, Austin, TX (US); Borna Obradovic, Leander, TX (US); Joon Goo Hong, Austin, TX (US); Mark Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/169,621

(22) Filed: May 31, 2016

(65) Prior Publication Data

US 2017/0110568 A1 Apr. 20, 2017

Related U.S. Application Data

(60) Provisional application No. 62/242,887, filed on Oct. 16, 2015.

(51) Int. Cl.
*H01L 29/78* (2006.01)
*H01L 29/66* (2006.01)

(52) U.S. Cl.
CPC ........ *H01L 29/785* (2013.01); *H01L 29/6653* (2013.01); *H01L 29/6656* (2013.01); *H01L 29/66795* (2013.01)

(58) Field of Classification Search
CPC ............... H01L 29/785; H01L 29/6653; H01L 21/31144; H01L 29/66795; H01L 21/31111; H01L 29/6656; H01L 2029/42388; H01L 29/1037; H01L 29/7851; H01L 29/7853; H01L 29/7854; H01L 29/41791; H01L 2029/7858; H01L 21/76829

See application file for complete search history.

(56) References Cited

U.S. PATENT DOCUMENTS

| | | | |
|---|---|---|---|
| 6,737,342 B1 | 5/2004 | Lee et al. | |
| 7,365,378 B2 | 4/2008 | Huang et al. | |
| 8,637,384 B2 | 1/2014 | Ando et al. | |
| 8,865,596 B2 | 10/2014 | Johnson | |
| 9,111,746 B2 | 8/2015 | Ranjan et al. | |
| 2001/0009788 A1* | 7/2001 | Lipkin | H01L 21/045 438/285 |
| 2005/0236694 A1* | 10/2005 | Wu | H01L 21/02126 257/632 |

(Continued)

OTHER PUBLICATIONS

Liu, Tsu-jae K., "FinFet History, Fundamentals and Future", 2012 Symposium on VLSI Technology Short Course, Jun. 11, 2012, pp. 1-55.*

(Continued)

*Primary Examiner* — Yu Chen
*Assistant Examiner* — Vincent Wall
(74) *Attorney, Agent, or Firm* — Lewis Roca Rothgerber Christie LLP

(57) ABSTRACT

A field effect transistor (FET) structure includes: a gate; a first spacer having a first dielectric constant at a first region adjacent to the gate; and a second spacer having a second dielectric constant that is greater than the first dielectric constant at a second region adjacent to the gate.

8 Claims, 10 Drawing Sheets

(56) References Cited

U.S. PATENT DOCUMENTS

| | | | |
|---|---|---|---|
| 2009/0316473 A1* | 12/2009 | Happ | G11C 13/0004 365/163 |
| 2011/0193175 A1* | 8/2011 | Huang | H01L 21/82343 257/386 |
| 2013/0309857 A1* | 11/2013 | Koburger, III | H01L 27/088 438/591 |
| 2014/0117455 A1* | 5/2014 | Liu | H01L 29/66795 257/368 |
| 2014/0138779 A1 | 5/2014 | Xie et al. | |
| 2014/0159159 A1* | 6/2014 | Steigerwald | H01L 29/66795 257/369 |
| 2014/0203370 A1* | 7/2014 | Maeda | H01L 29/785 257/365 |
| 2014/0264482 A1* | 9/2014 | Li | H01L 21/02532 257/288 |
| 2014/0273397 A1* | 9/2014 | Rodder | H01L 21/76 438/400 |
| 2015/0060960 A1* | 3/2015 | Xie | H01L 29/785 257/288 |
| 2015/0076606 A1 | 3/2015 | Cheng et al. | |
| 2015/0162332 A1 | 6/2015 | Kim et al. | |
| 2015/0221676 A1 | 8/2015 | Holt et al. | |
| 2015/0228499 A1 | 8/2015 | Parkinson et al. | |
| 2015/0243760 A1 | 8/2015 | He et al. | |
| 2015/0249017 A1 | 9/2015 | Raley et al. | |
| 2015/0294969 A1* | 10/2015 | Lee | H01L 27/0886 257/401 |
| 2015/0340490 A1* | 11/2015 | An | H01L 29/785 257/401 |
| 2017/0018623 A1* | 1/2017 | Suk | H01L 29/42392 |
| 2017/0018644 A1* | 1/2017 | Suk | H01L 29/7848 |

OTHER PUBLICATIONS

Jovanovic, et al.; ResearchGate; FinFET technology for wide-channel devices with ultra-thin silicon body; Oct. 19, 2015; six (6) sheets.

* cited by examiner

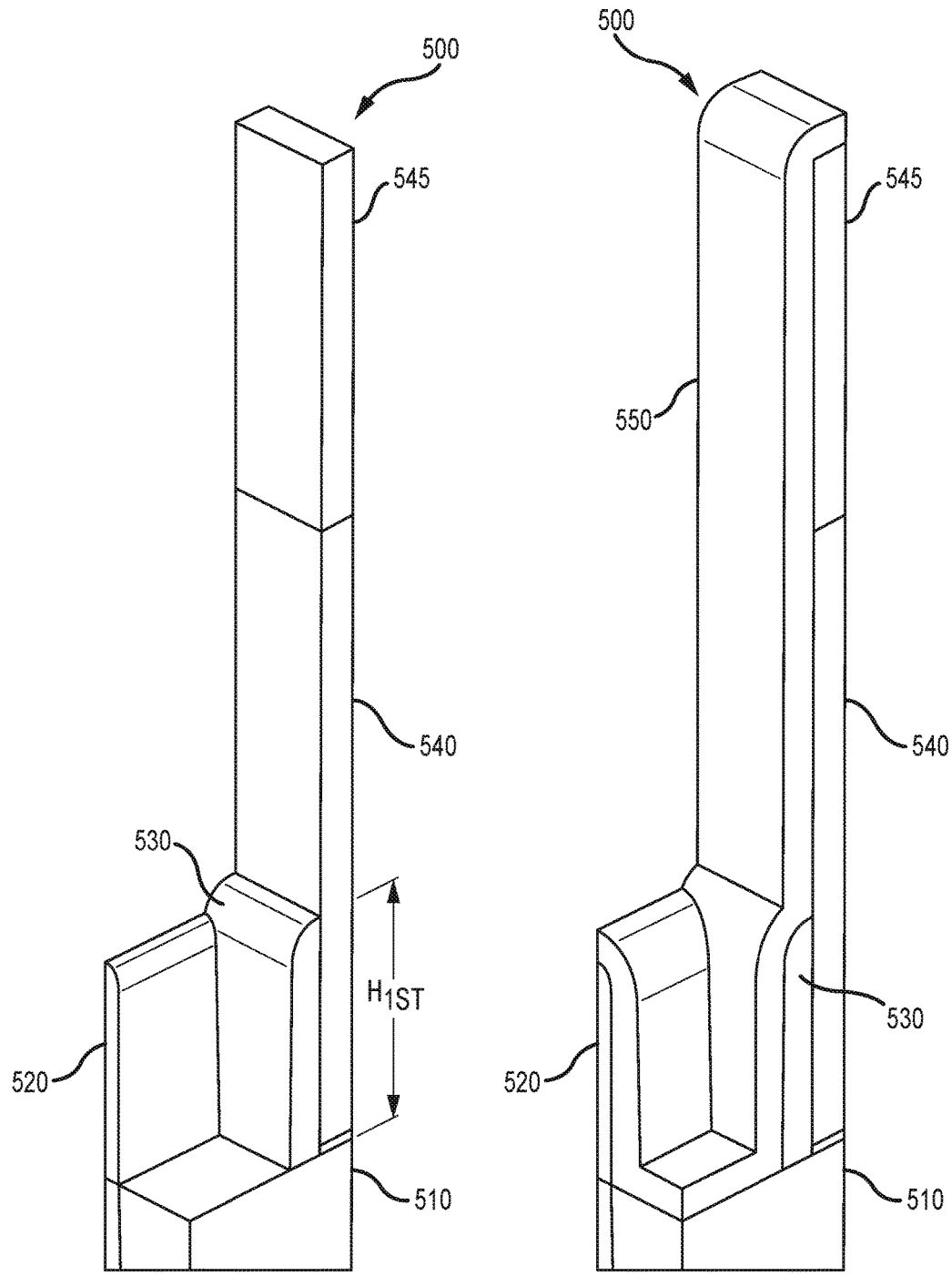

FINFET HAVING DUAL VERTICAL SPACER AND METHOD OF MANUFACTURING THE SAME

CROSS-REFERENCE TO RELATED APPLICATION(S)

This utility patent application claims priority to and the benefit of U.S. Provisional Patent Application Ser. No. 62/242,887, filed Oct. 16, 2015, entitled "DUAL VERTICAL SPACER FOR FINFET WITH REDUCED FRINGE CAPACITANCE" the entire content of which is incorporated herein by reference.

BACKGROUND

1. Field

One or more aspects of example embodiments of the present invention relate to high performance and high reliability CMOS technology.

2. Related Art

The capacitance of a chip can be roughly partitioned into backend-of-line (BEOL) and frontend-of-line (FEOL) capacitance. For higher performance and lower power, low BEOL and FEOL capacitance is desired. The BEOL capacitance may be due primarily to interconnects, while the FEOL capacitance may include the capacitance due to devices. It is desired that scaling of devices in every generation results in lower BEOL and FEOL capacitance.

A Fin Field Effect Transistor (FinFET) device capacitance may be partitioned into gate capacitance and parasitic capacitance. The gate capacitance is an essential component of the device operation, and while the gate capacitance may generally decrease with scaling, the parasitic capacitance may not necessarily decrease. In fact, of the various contributions to device parasitic capacitance, such as gate-to-sidewall fringe, gate-to-source/drain epi fringe coupling, gate-to-source/drain plug coupling (also referred to as MOL capacitance), etc., the fringe capacitance may not decrease with scaling.

The above information disclosed in this Background section is for enhancement of understanding of the background of the invention, and therefore, it may contain information that does not constitute prior art.

SUMMARY

One or more example embodiments according to the present invention provide for a semiconductor device, e.g. a FinFET, with both high reliability and low parasitic capacitance, the low parasitic capacitance enabling high performance.

One or more example embodiments according to the present invention may be applicable to the field of electronic device or systems composed of chips or systems on chip (SoC) which use a finFET as the fundamental switching unit.

According to an example embodiment of the present invention, a field effect transistor (FET) structure includes: a gate; a first spacer having a first dielectric constant at a first region adjacent to the gate; and a second spacer having a second dielectric constant that is greater than the first dielectric constant at a second region adjacent to the gate.

In an embodiment, the first region may be below the second region, and the first and second regions may be between the gate and at least one of a source or a drain.

In an embodiment, a spacer material for the second spacer may have a sufficient etch resistance to a contact etch processing, and wherein the spacer material for the second spacer has a higher etch resistance to the contact etch processing than that of the first spacer.

In an embodiment, the first spacer and the second spacer may have a same thickness, and each of the first spacer and the second spacer may include a single insulating material or multiple insulating materials.

In an embodiment, the first spacer may have a dielectric constant less than 4, and the second spacer may have a dielectric constant greater than 4 and less than 7.

In an embodiment, the FET structure may be a finFET structure including a fin.

In an embodiment, the first spacer may be generally below a top of the fin, and the second spacer may be generally above the top of the fin.

In an embodiment, the first spacer may reduce gate-to-source, gate-to-fin sidewall, and/or gate-to-drain fringe capacitance coupling.

In an embodiment, the first spacer may include at least one carbon, hydrogen, or fluorine doped oxides of silicon, and the second spacer may include at least one of SiON, SiOCN, SiCBN, SiCN, or $Si_3N_4$.

According to an example embodiment of the present invention, a method of manufacturing a fin field effect transistor (FinFET) including an insulator, a fin on the insulator and extending above the insulator, a poly gate on the insulator and extending above the fin, and a hard mask on the poly gate, includes: forming a first spacer having a first dielectric constant on the poly gate; and forming a second spacer having a second dielectric constant that is greater than the first dielectric constant on the first spacer.

In an embodiment, the forming of the first spacer may include: depositing a first spacer material on the poly gate; and etching the first spacer material.

In an embodiment, the etching of the first spacer material may include: anisotropically etching the first spacer material in a timed manner to remove most of the first spacer material above the fin.

In an embodiment, an etchant used to etch the first spacer material may include at least one of chlorine based organic gas or fluorine based organic gas.

In an embodiment, the first spacer material may include at least one of carbon, hydrogen, or fluorine doped oxides of silicon.

In an embodiment, the forming of the second spacer may include: depositing a second spacer material on the first spacer, the poly gate, and the hard mask; and etching the second spacer material.

In an embodiment, the etching of the second spacer material may include: anisotropically etching the hard mask and the second spacer material in a timed manner.

In an embodiment, the second spacer material may have a sufficient etch resistance to a contact etch processing, and the second spacer material may have a higher etch resistance to the contact etch processing than that of the first spacer.

In an embodiment, the second spacer material may include at least one of SiON, SiOCN, SiCBN, SiCN, or $Si_3N_4$.

According to an example embodiment of the present invention, a fin field effect transistor (FinFET) device includes: a fin; a gate, a source, and a drain on the fin; an insulator surrounding a portion of the fin; a first spacer on the insulator between the gate and the source and/or between the gate and the drain, the first spacer having a first dielectric constant; and a second spacer on the first spacer between the gate and the source and/or between the gate and the drain, the second spacer having a second dielectric constant that is greater than the first dielectric constant.

In an embodiment, the second spacer may be generally above a top of the fin, and the first spacer may be generally below the top of the fin.

BRIEF DESCRIPTION OF THE DRAWINGS

The above and other aspects and features of the present invention will become more apparent to those skilled in the art from the following detailed description of the example embodiments with reference to the accompanying drawings.

FIGS. 5A-5E illustrate fabrication process diagrams of a portion of a FinFET of FIGS. 3A-3C according to one or more example embodiments of the present invention.

DETAILED DESCRIPTION

Figure 1A:
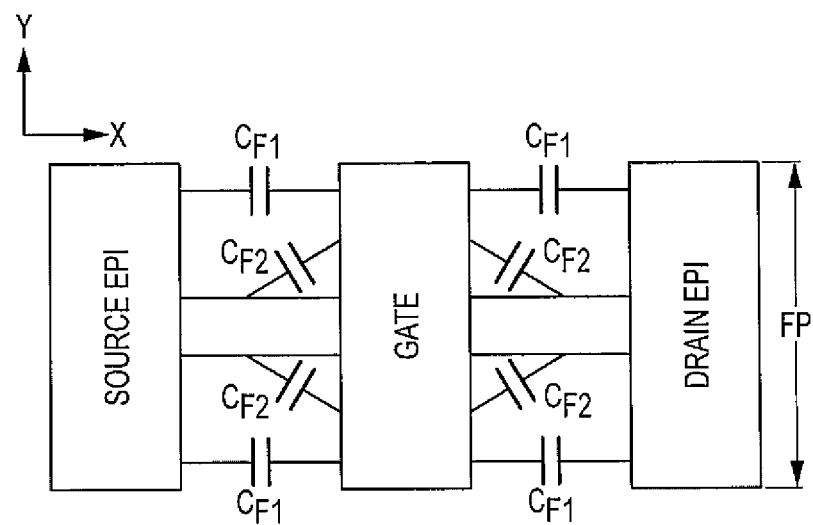
FIGS. 1A-1B illustrate various fringe capacitance components in a FinFET.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
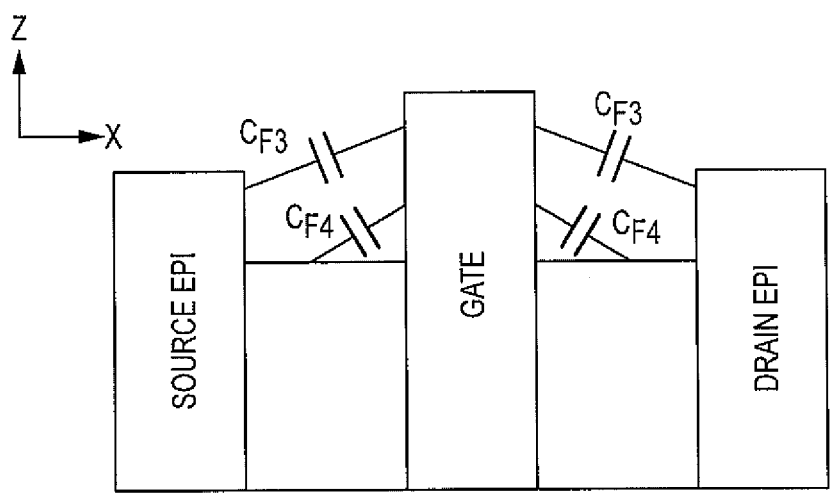

FIGS. 1A and 1B illustrate various fringe capacitance components in a FinFET device. FIG. 1A is a top view of the FinFET device and FIG. 1B is a side view of the FinFET device.

Referring to FIGS. 1A and 1B, the various fringe capacitance components, generally referred to as Cfringe, of the FinFET device may include gate to bottom source/drain fringe capacitance (CF1), gate to fin sidewall fringe capacitance (CF2), gate to top source/drain fringe capacitance (CF3), and gate to fin top capacitance (CF4).

From among the various fringe capacitances Cfringe, the CF2 may be a large contributor to the total capacitance of the device (or to the total FEOL capacitance CFEOL), and can be as high as 30%, for example. For example, reducing the total CF2 contribution may significantly improve the performance of the front end loaded circuits (e.g., circuits where CFEOL is more than 50% of the total circuit or chip capacitance referred to as Ceff). The circuit/chip speed is proportional to the total circuit/chip capacitance (Ceff).

Figure 2:
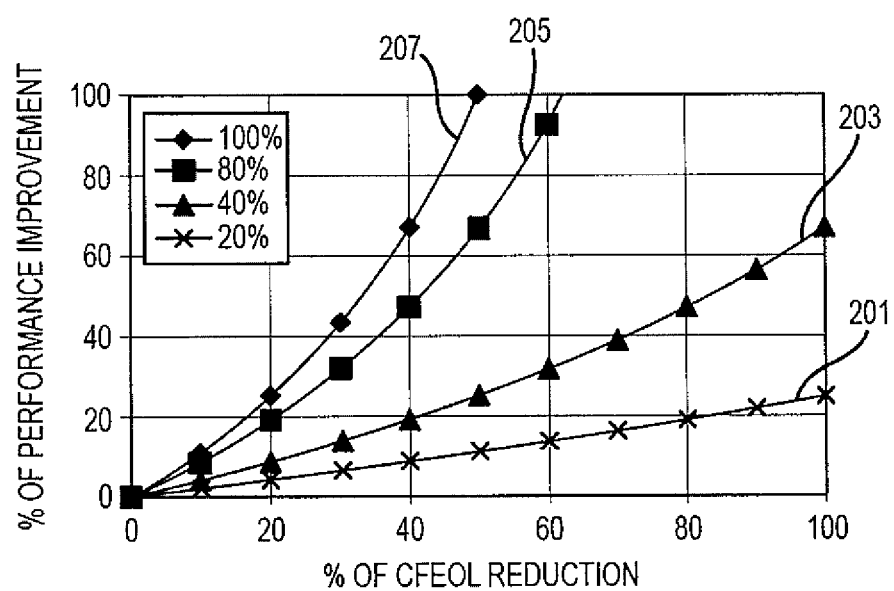
FIG. 2 illustrates a performance improvement of a circuit due to CFEOL reduction for CFEOL=20, 40, 80 and 100% of total circuit capacitance (Ceff).

FIG. 2 illustrates a performance improvement of a circuit due to CFEOL reduction for CFEOL=20, 40, 80 and 100% of total circuit/chip capacitance (Ceff). In FIG. 2, the X-axis represents percentage of CFEOL reduction and the Y-axis represents percentage of performance improvements. Each of the lines represents the CFEOL as a fraction of the Ceff. Line 201 represents the CFEOL as 20% of the Ceff, line 203 represents the CFEOL as 40% of the Ceff, line 205 represents the CFEOL as 80% of the Ceff, and line 207 represents the CFEOL as 100% of the Ceff.

As shown in FIG. 2, by reducing the CFEOL, the overall performance of the circuit may be improved. For example, referring to line 203, when the CFEOL accounts for 40% of the Ceff, by reducing the CFEOL by 40%, there is about 16-20% improvement in the overall performance of the circuit.

One way to reduce both MOL capacitance and fringe capacitance Cfringe (e.g., CF1, CF2, CF3, CF4, etc.) is to use a low-k spacer (where k is a dielectric constant). For example, amongst other requirements, the spacer material(s) between the gate and the contacts should be resistant to contact etch processing (e.g., the spacer material between the gate and the contacts should have a sufficiently low etch rate associated with the contact etch process) and should satisfy the reliability criteria. However, the spacer material(s) below the contact level in a top contacted device may be less resistant to contact etch processing (e.g., the spacer material below the contact level does not need to have as low an etch rate as the spacer material between the gate and the contacts associated with the contact etch process), while still ensuring that the device meets overall reliability criteria.

One or more example embodiments according to the present invention provide a method for creating, and a structure having, a dual vertical spacer stack with an ultra-low-k spacer (e.g., about k<4) between the gate and the epi-source/drain in a lower part of the finFET (e.g. a first region) and a low-k (e.g., not as low a k value as the ultra-low-k spacer material in the first region, for example, about 4<k<7) spacer material with sufficient etch resistance to the contact etch processing step in the upper part of the finFET (e.g., a second region). Hence, in one or more example embodiments, an ultra-low-k spacer is used in the lower part of the fin to reduce CF2 (and/or other fringe capacitance components) and a low-k spacer is used in the top part of the device to satisfy etch and reliability requirements.

In general, the use of a spacer material having too low of a k-value (e.g. referred to as an ultra-low-k spacer) in the second region between gate and the contacts (affecting MOL capacitance) may result in poor reliability of the device (e.g., not meeting reliability criteria), and/or may result in gate to source/drain shorts due to substantial exposure of the second region to the contact etch processing step during device fabrication. However, if a spacer material is utilized in the first region of the device that is not substantially exposed to this contact etch processing step, then an ultra-low-k spacer material may be utilized in this first region without resulting in poor reliability of the device and/or causing gate to source/drain shorts.

To avoid or reduce the problem of poor reliability of the device and/or gate to source/drain shorts, but to achieve a substantially low FEOL capacitance CFEOL, and in particular, a substantially low Cfringe, one or more example embodiments according to the present invention provide the use of the ultra-low-k spacer in the first region and the use of the low-k spacer in the second region. The first region may be the region that is not substantially exposed to a contact etch processing step. That is, the first region may be substantially comprised of the region below the contact level in a substantially top contacted device.

Figure 3A:
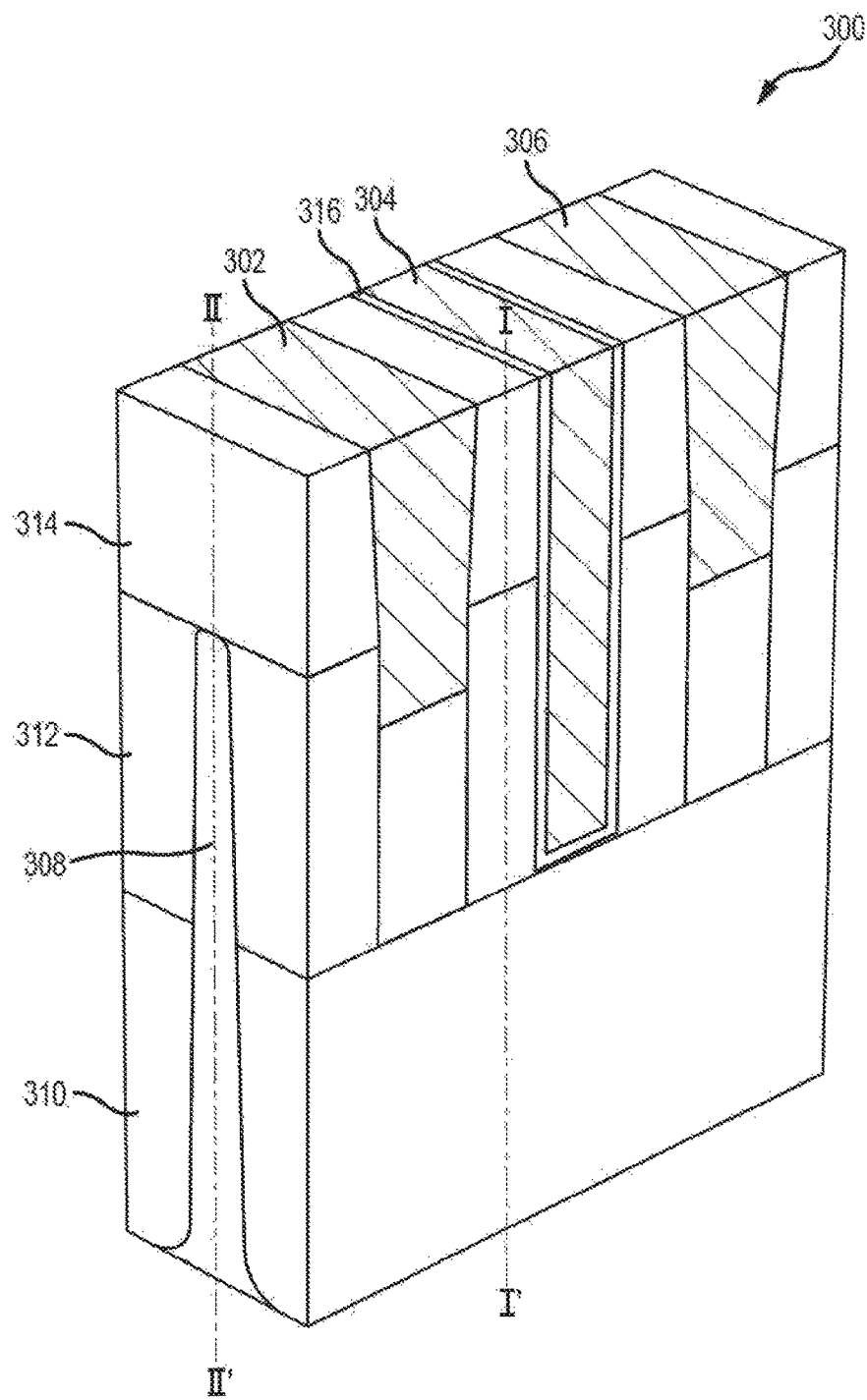
FIGS. 3A-3C illustrate partial views of a FinFET according to one or more example embodiments of the present invention.
Figure 3B:
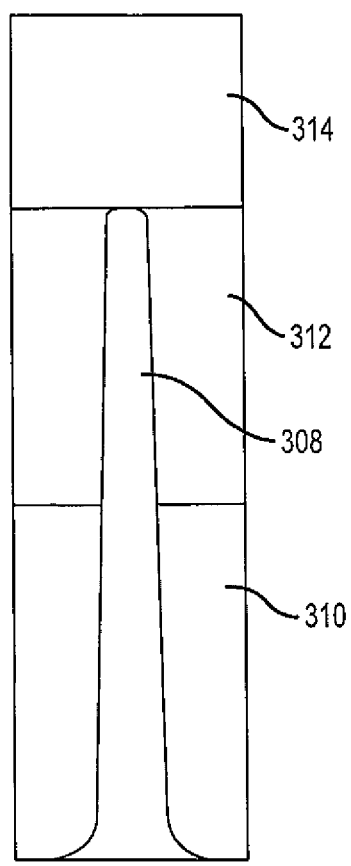
Figure 3C:
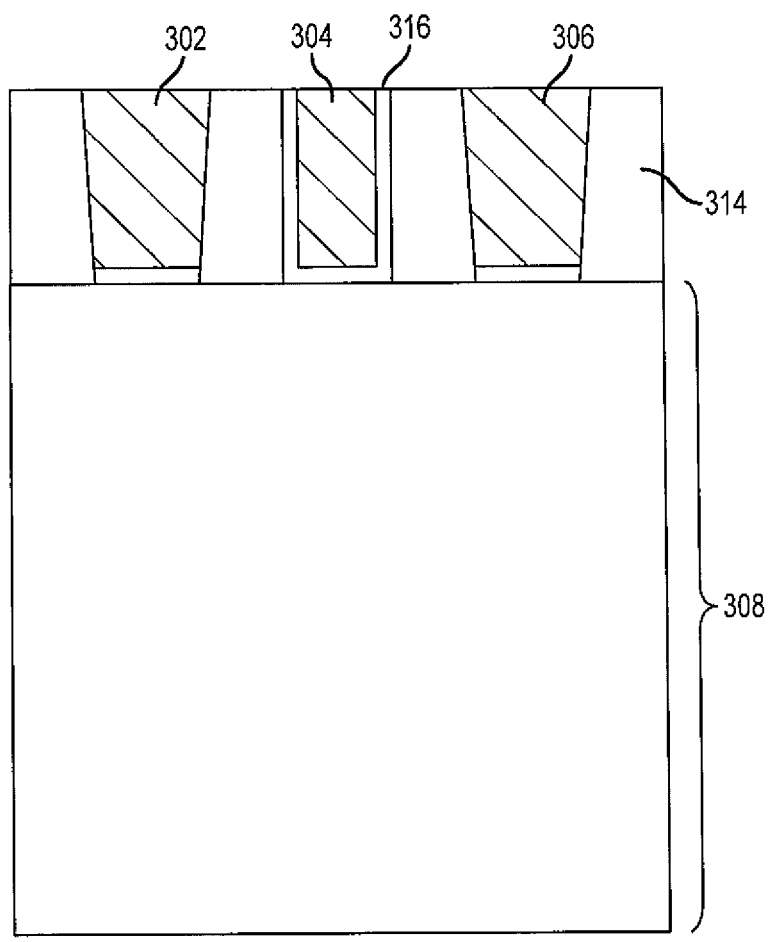

FIGS. 3A-3C illustrate partial views of a FinFET according to one or more example embodiments of the present invention. FIG. 3A is a perspective view of a portion of the FinFET according to one or more embodiments of the present invention, FIG. 3B is a cross-sectional side view of the FinFET along the line I-I' of FIG. 3A, and FIG. 3C is a cross-sectional front view of the FinFET along the line II-II' of FIG. 3A.

Referring to FIGS. 3A through 3C, a FinFET 300 includes a first electrode (e.g., a first electrode metal) 302, a gate (e.g., a gate metal) 304, a gate dielectric 316, a second electrode (e.g., a second electrode metal) 306, and a fin (e.g., a channel fin) 308. The first electrode 302 may be one of a source and a drain, and the second electrode 306 may be the other one of the source and the drain. For example, when the first electrode 302 is the source, the second electrode 306 may be the drain, and when the first electrode 302 is the drain, the second electrode 306 may be the source.

The FinFET 300 may further include an insulator (e.g., a shallow trench insulator ST1) 310, a lower spacer or a first spacer (e.g., an ultra-low-k spacer) 312 on the insulator 310 at the first region, and an upper spacer or a second spacer (e.g., a low-k spacer) 314 on the lower spacer 312 at the second region. The lower and upper spacers 312 and 314 may be interposed between the gate 304 and the first electrode 302, and may be interposed between the gate 304 and the second electrode 306.

According to one or more embodiments of the present invention, the lower spacer (e.g., the ultra-low-k spacer) 312 may have a dielectric constant value k of about k<4, and the upper spacer (e.g., the low-k spacer) 314 may have a dielectric constant value k that is greater than that of the lower spacer 312 (e.g., about 4<k<7). However, the present invention is not limited thereto, and the lower and upper spacers 312 and 314 may have any suitable dielectric constant value k as long as the upper spacer 314 has a greater dielectric constant value than that of the lower spacer 312 and meets the desired reliability criteria.

Figure 4:
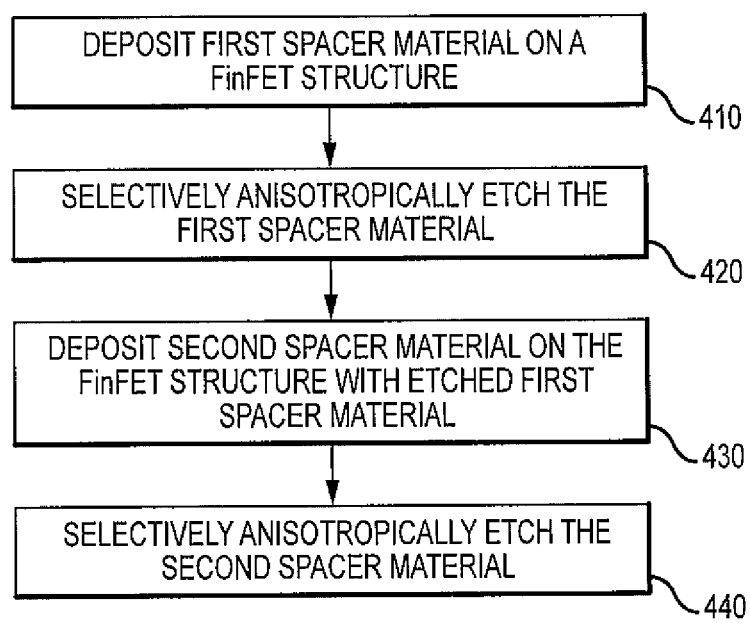
FIG. 4 is a flow diagram illustrating a fabrication process of a portion of a FinFET of FIGS. 3A-3C according to one or more example embodiments of the present invention.

FIG. 4 is a flow diagram illustrating a fabrication process of a portion of a FinFET of FIGS. 3A through 3C according to one or more example embodiments of the present invention, and FIGS. 5A-5E illustrate fabrication process diagrams of a portion of a FinFET of FIGS. 3A-3C according to one or more example embodiments of the present invention. FIGS. 5A through 5E illustrate a FinFET structure 500 of a portion of the FinFET 300 shown in FIGS. 3A-3C between a portion of the gate 304 and a portion of the first electrode 302 prior to forming the first electrode 302 and the gate 304 on the fin 308. However, the present invention is not limited to the sequence or number of the operations of the method shown in FIGS. 4 and 5A through 5C, and can be altered into any desired sequence or number of operations as recognized by a person of ordinary skill in the art. For example, in some embodiments, the order may vary, or the method may include fewer or additional operations.

Figures 5A, 5B:
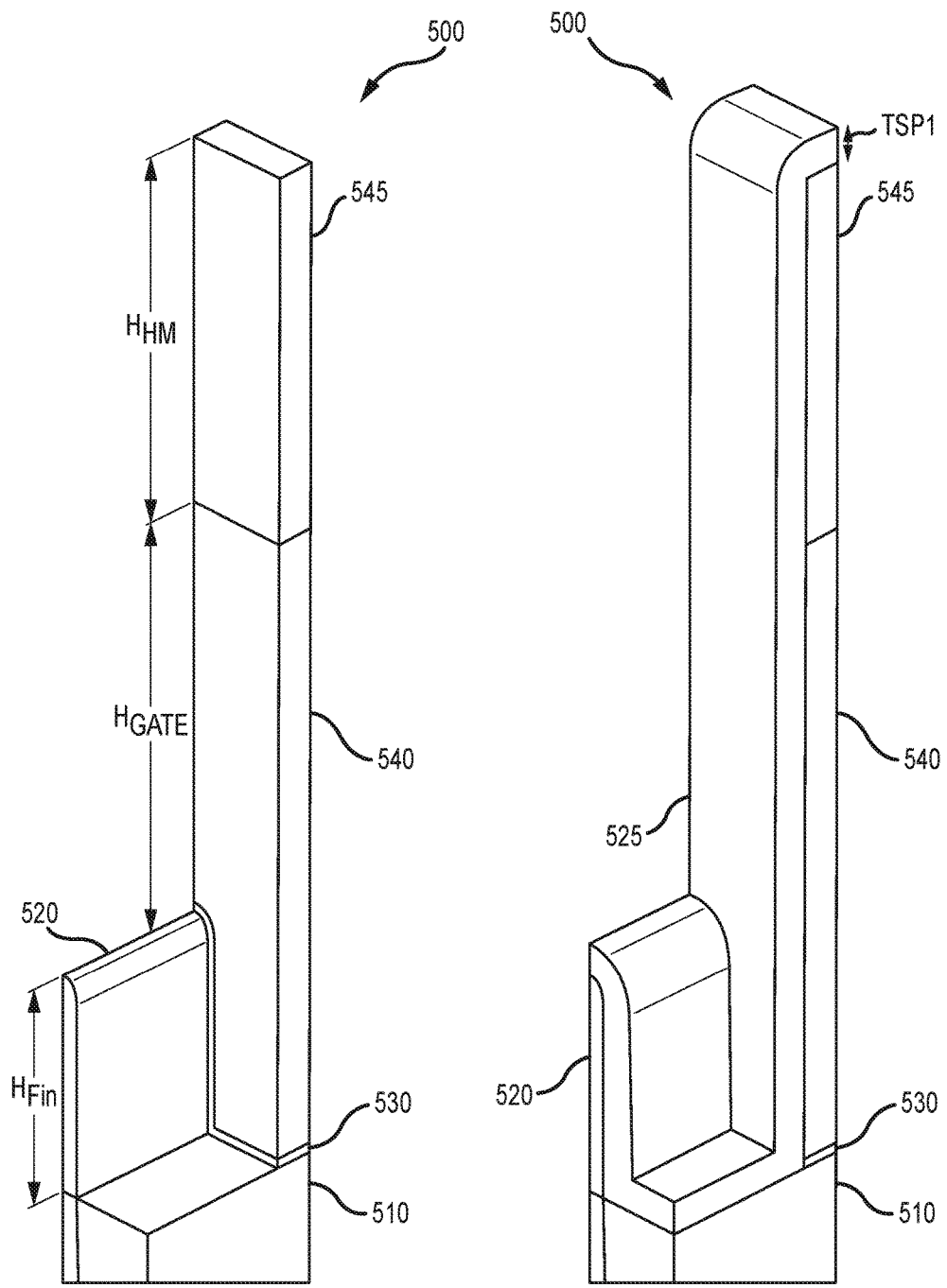

As can be seen in FIG. 5A, prior to fabrication of the upper and lower spacers, the FinFET structure 500 includes an insulator (e.g., an STI) 510, a fin 520, a gate dielectric 515, a dummy gate (or a polygate) 540, and a hard mask (HM) (e.g., a tall hard mask) 545. The FinFET structure 500 of FIG. 5A may be formed using any suitable process that is known to those skilled in the art.

In one or more example embodiments, a height $H_{HM}$ of the HM 545 is about 90 nm, a height $H_{gate}$ of the dummy gate 540 from a top of the fin 520 to the HM is about 100 nm, and a height $H_{fin}$ of the fin 520 from a top surface of the insulator 510 is about 60 nm (e.g., generally, $H_{HM} > H_{fin}$), so that a total height of the gate is about 160 nm. Therefore, a total combined vertical height of the dummy gate 540 and the HM 545 from a top surface of the insulator 510 is about 250 nm, but the present invention is not limited thereto.

Turning now to FIG. 4, at block 410 according to one or more example embodiments of the present invention, first spacer material is deposited on the FinFET structure 500 of FIG. 5A to form the first spacer material deposit 525 as illustrated in FIG. 5B. The first spacer material is deposited (e.g., blanket deposited) to a thickness $T_{SP1}$ of about 10 nm, for example, in one or more example embodiments, but the present invention is not limited thereto. In one or more example embodiments, the first spacer material includes an ultra low-k material including at least one of carbon, hydrogen, or fluorine doped oxides of silicon (e.g., SiOC, SiOF, SiOH, SiOCH, etc.) with a dielectric constant k<4, but the present invention is not limited thereto. For example, when the ultra low-k material includes SiOCH, the dielectric constant value k may be about 2.8, about 2.1, or in a range between about 2.1 and about 2.8, depending on the porosity of the material. Because of the blanket deposition of the first spacer material with a thickness of about 10 nm, for example, the total combined height of the dummy gate 540, the HM 545, and the first spacer material 525 is now, for example, at about 260 nm.

In one or more example embodiments, the first spacer material may include one or more materials that form multiple lateral layers, and one or more of the materials for the multiple lateral layers may include the ultra low-k material, such that the effective dielectric constant k of the multiple materials is in the desired range (e.g., k<4) for the ultra low-k material. For example, the isotropic deposition of the first spacer material may include deposition of multiple layers at once, such that the total thickness of the deposited layers is equal to the desired physical thickness of the spacer layers.

At block 420 of FIG. 4, according to one or more example embodiments of the present invention, the deposited first spacer material is selectively anisotropically etched in a timed manner (e.g., a selective anisotropic timed etching is performed). Here, for example, dry etching may be performed with high selectivity with respect to the fin material to etch mostly the deposited first spacer material. The etchant in one or more example embodiments may be chlorine/fluorine based organic gases. For example, the etch thickness (e.g., deep etch thickness) may be about 200 nm (e.g., $>=T_{SP1}+H_{HM}+H_{gate}$) according to one or more example embodiments, so that as shown in FIG. 5C, a height $H_{1st}$ of the remaining first spacer material 530 from the top surface of the insulator 510 (e.g., at the second region) is about 60 nm (e.g., 60+100+90+10−200), but the present invention is not limited thereto. After the etching, as illustrated in FIG. 5C, the FinFET structure now includes the insulator (STI) 510, the fin 520, the first spacer (or the lower spacer) 530 at the second region, the dummy gate (e.g., the polygate) 540, and the NM 545. Hence, the first spacer material 525 is substantially etched away from the FinFET structure 500, except for the first spacer 530 at the second region.

At block 430 of FIG. 4, according to one or more example embodiments of the present invention, second spacer material 550 is deposited (e.g., blanket deposited) on the FinFET structure 500 of FIG. 5C to form the second spacer material deposit 550 as illustrated in FIG. 5D. The second spacer material is deposited to a thickness of about 10 nm, for example, in one or more example embodiments, but the present invention is not limited thereto. In one or more example embodiments, the second spacer material includes a low-k material (e.g., SiON, SiOCN, SiCBN, SiCN, $Si_3N_4$, etc.) having an effective dielectric constant k (e.g., 4<k<7) that is greater than the effective dielectric constant k of the ultra low-k material used to form the first spacer 530, but the present invention is not limited thereto. Because the thickness of the second spacer material deposit is 10 nm, as can be seen in FIG. 5D, the total combined height of the dummy gate 540, the HM 545, and the second spacer material deposit 550 is now, for example, at about 260 nm.

In one or more example embodiments, the second spacer material 550 may include one or more materials that form multiple lateral layers, and one or more of the materials for the multiple lateral layers may include the low-k material, such that the effective dielectric constant k of the multiple materials is greater than the effective dielectric constant k of the ultra low-k material used to form the first spacer 530. For example, the isotropic deposition of the second spacer material may include deposition of multiple layers at once, such that the total thickness of the deposited layers is equal to or substantially equal to the desired physical thickness of the spacer layers.

At block 440 of FIG. 4, according to one or more example embodiments of the present invention, the deposited second spacer material is selectively anisotropically etched in a timed manner (e.g., a selective anisotropic timed etching is performed) together with the hard mask (HM) 545. Here, for example, dry etching may be performed to etch both the HM 545 and the deposited second spacer material 550 to form a second spacer 555. For example, the etch thickness (e.g., deep etch thickness) may be about 65 nm (e.g., generally $>H_{fin}$) according to one or more example embodiments, but the present invention is not limited thereto. Further, the etching also etched away a portion of the HM 545, such that the total height of the HM 545 and the second spacer 555 at a portion where the second spacer 555 extends over the dummy gate 540 is about 35 nm. Hence, the total combined height of the HM 545, the second spacer 555 and the dummy gate 540 is now about 175 nm, but the present invention is not limited thereto.

Figure 5E:
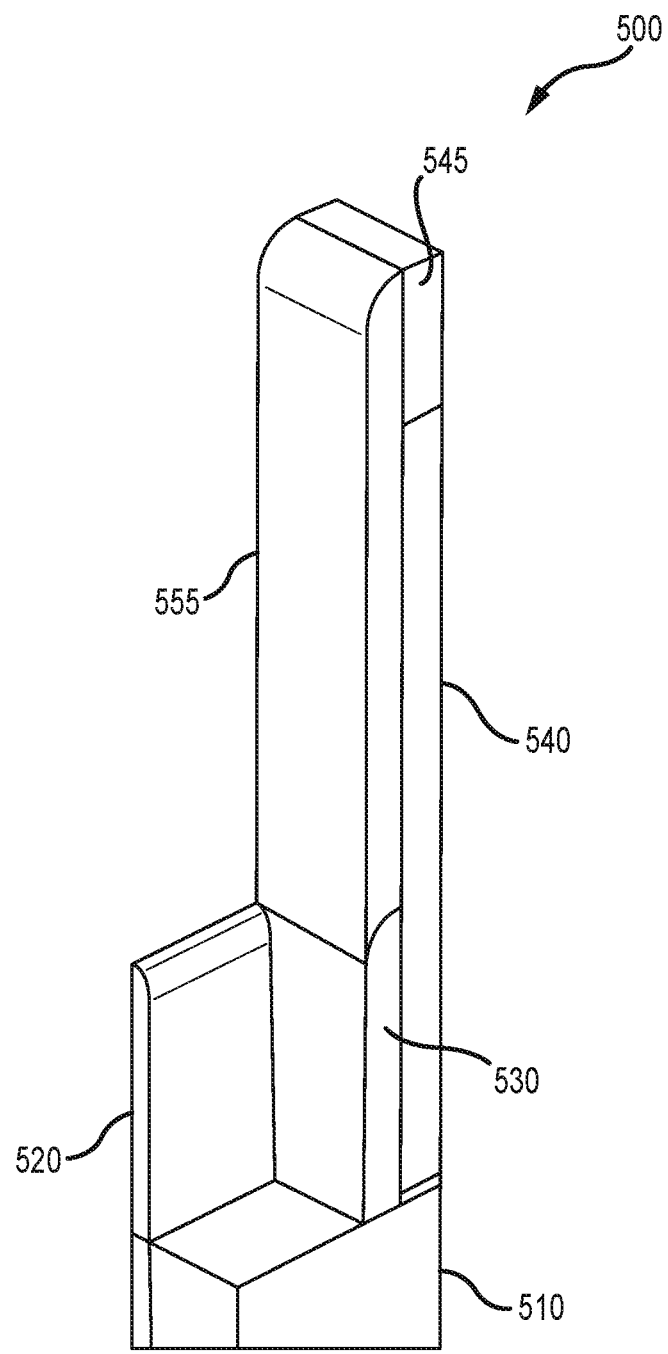

After the etching, as illustrated in FIG. 5E, the FinFET structure 500 now includes the insulator (STI) 510 (e.g. corresponding to the insulator 310 in FIG. 3A), the fin 520 (e.g., corresponding to the fin 308 in FIG. 3A), the first spacer (or the lower spacer) 530 (e.g., corresponding to the first spacer 312 in FIG. 3A) at the first region, the dummy gate (e.g., the polygate) 540, the HM 545, and the second spacer (or the upper spacer) 555 (e.g., corresponding to the second spacer 314 in FIG. 3A) at the second region. Hence, the second spacer material is substantially etched away from the FinFET structure 500, except for the second spacer 555 at the second region.

The remaining elements of the FinFET device 300 shown in FIGS. 3A through 3C may be formed using any suitable process that is known to those skilled in the art on the FinFET structure 500 shown in FIG. 5E to produce a completed FinFET device.

The spacer formation approach described in the present application may result in a FinFET with low fringe capacitance and thereby low FEOL capacitance and yet retain etch and reliability requirements of a spacer between a gate and contact material.

Figure 6:
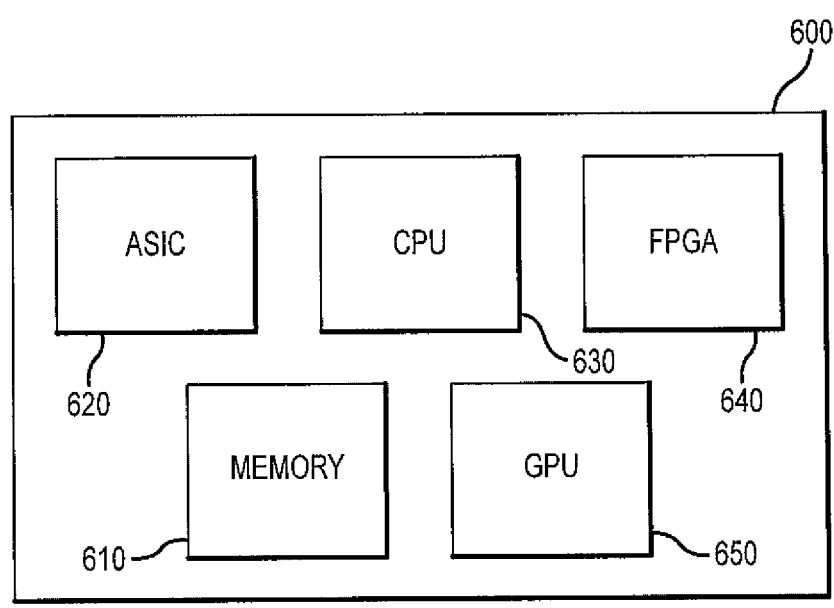
FIG. 6 illustrates an electronic device including a FinFET according to one or more embodiments of the present invention.

FIG. 6 illustrates an electronic device including a FinFET according to one or more embodiments of the present invention.

Referring to FIG. 6, an electronic device 600 may include at least one of a memory 610, an application specific integrated circuit (ASIC) 620, a central processing unit (CPU) 630, a field programmable gate array (FPGA) 640, and a graphics processing unit (GPU) 650. The FinFET may be included in any one of the memory 610, the ASIC 620, the CPU 630, the FPGA 600, and the GPU 650.

The electronic device 600 may be a stand-alone system that uses the FinFET to perform one or more electrical functions. Alternatively, the electronic device 600 may be a subcomponent of a larger system. For example, the electronic device 600 may be part of a computer, a cellular phone, a personal digital assistant (PDA), a digital video camera (DVC), or other electronic communication device. Alternatively, the electronic device 600 may be the memory 610, the ASIC 620, the CPU 630, the FPGA 640, the GPU 650, a network interface card, or other signal processing card that can be inserted or included in a computer or other larger system.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. A field effect transistor (FET) structure comprising:
a fin;
a gate on the fin, the gate comprising a gate dielectric;
a shallow trench insulator surrounding a portion of the fin;
at least one of a source electrode and a drain electrode on the fin;
a first spacer on the fin and the shallow trench insulator, the first spacer having a first dielectric constant at a first region adjacent to the gate; and
a second spacer on the fin and the first spacer, the second spacer having a second dielectric constant that is greater than the first dielectric constant at a second region adjacent to the gate,
wherein the first spacer extends from below a top surface of the fin to the top surface of the fin, wherein a portion of the first spacer is between the gate and at least one of the source electrode and the drain electrode, and the second spacer only extends from the top surface of the fin towards a top of the gate, wherein a portion of the second spacer is between the gate and the at least one of the source electrode and the drain electrode,
wherein a bottom surface of the at least one of the source electrode and the drain electrode is above a bottom surface of the gate dielectric and below the top surface of the fin, and
wherein a top surface of the at least one of the source electrode and the drain electrode is coplanar with a top surface of the gate dielectric.

2. The FET structure of claim 1, wherein a spacer material for the second spacer has a sufficient etch resistance to a contact etch processing, and wherein the spacer material for the second spacer has a higher etch resistance to the contact etch processing than that of the first spacer.

3. The FET structure of claim 1, wherein the first spacer and the second spacer have a same thickness, and wherein each of the first spacer and the second spacer comprises a single insulating material or multiple insulating materials.

4. The FET structure of claim 1, wherein the first spacer has a dielectric constant less than 4, and the second spacer has a dielectric constant greater than 4 and less than 7.

5. The FET structure of claim 1, wherein the FET structure is a finFET structure comprising the fin.

6. The finFET structure of claim 5, wherein the first spacer reduces gate-to-source, gate-to-fin sidewall, and/or gate-to-drain fringe capacitance coupling.

7. The finFET structure of claim 5, wherein the first spacer comprises at least one of carbon, hydrogen, or fluorine doped oxides of silicon, and the second spacer comprises at least one of SiON, SiOCN, SiCBN, SiCN, or Si3N4.

8. A fin field effect transistor (FinFET) device comprising:
a fin;
a gate, a source electrode, and a drain electrode on the fin, the gate comprising a gate dielectric;
a shallow trench insulator surrounding a portion of the fin;
a first spacer on the shallow trench insulator and the fin between the gate and the source electrode and/or between the gate and the drain electrode, the first spacer having a first dielectric constant; and
a second spacer on the first spacer and the fin between the gate and the source electrode and/or between the gate and the drain electrode, the second spacer having a second dielectric constant that is greater than the first dielectric constant,
wherein the first spacer extends from below a top surface of the fin to the top surface of the fin, wherein a portion of the first spacer is between the gate and the source electrode and/or the drain electrode, and the second spacer only extends from the top surface of the fin towards a top of the gate, wherein a portion of the second spacer is between the gate and the source electrode and/or the drain electrode,
wherein the second spacer is entirely separated from the shallow trench insulator between the gate and the source electrode and/or the drain electrode by the first spacer,
wherein a bottom surface of the source electrode and/or the drain electrode is above a bottom surface of the gate dielectric and below the top surface of the fin, and
wherein a top surface of the source electrode and/or the drain electrode is coplanar with a top surface of the gate dielectric.

* * * * *